United States Patent [19]

Foxall

[11] Patent Number: 4,800,494
[45] Date of Patent: Jan. 24, 1989

[54] METHOD AND APPARATUS FOR EXECUTION OF MULTISLICE IMAGING EXPERIMENTS

[75] Inventor: David L. Foxall, San Jose, Calif.

[73] Assignee: Varian Associates, Inc., Palo Alto, Calif.

[21] Appl. No.: 29,284

[22] Filed: Mar. 23, 1987

[51] Int. Cl.$^4$ .................. G06F 15/42; G01R 33/22
[52] U.S. Cl. .................. 364/413.13; 324/309
[58] Field of Search ........... 364/414; 324/309, 307; 378/21, 4; 73/619, 626

[56] References Cited

U.S. PATENT DOCUMENTS 4,665,367 5/1987 Kramer et al. .................. 324/309

OTHER PUBLICATIONS

D. I. Hoult, "Rotating Frame Zeugmatography", Journal of Magnetic Resonance, 33, (1979), pp. 183–197.
"Communications, Towards Biochemical Imaging", Journal of Magnetic Resonance, 40, pp. 209–212, (1980).
H. N. Shapiro, "Introduction to the Theory of Numbers", John Wiley & Sons, pp. 131–188, (1983).
B. M. Stewart, "Theory of Numbers", the Macmillan Company, New York, Second Edition, pp. 89–95.

Primary Examiner—Jerry Smith
Assistant Examiner—Stephen M. Baker
Attorney, Agent, or Firm—Stanley Z. Cole; Gerald M. Fisher; Terrence E. Dooher

[57] ABSTRACT

A method and apparatus for exciting slices of an object in an NMR device in a specific order. N slices are indexed from 0 to $(N-1)$. An integer X relatively prime to N is selected and the finite sequence $I_0+kX$, $k=0, \ldots, (N-1)$ is generated where $I_0$ is a selected integer. The least positive residue $r_k$ satisfying $r_k \equiv I_0 + kX (\text{Mod } N)$ is calculated and then the slice $S_{r_k}$ is excited before the slice $S_{r(k+1)}$ for $k=0, \ldots, (N-2)$. The method and apparatus disclosed ensures that slices are excited in an order which reduces the resonant signal contamination present in a slice from the excitation of previously excited slices.

10 Claims, 3 Drawing Sheets

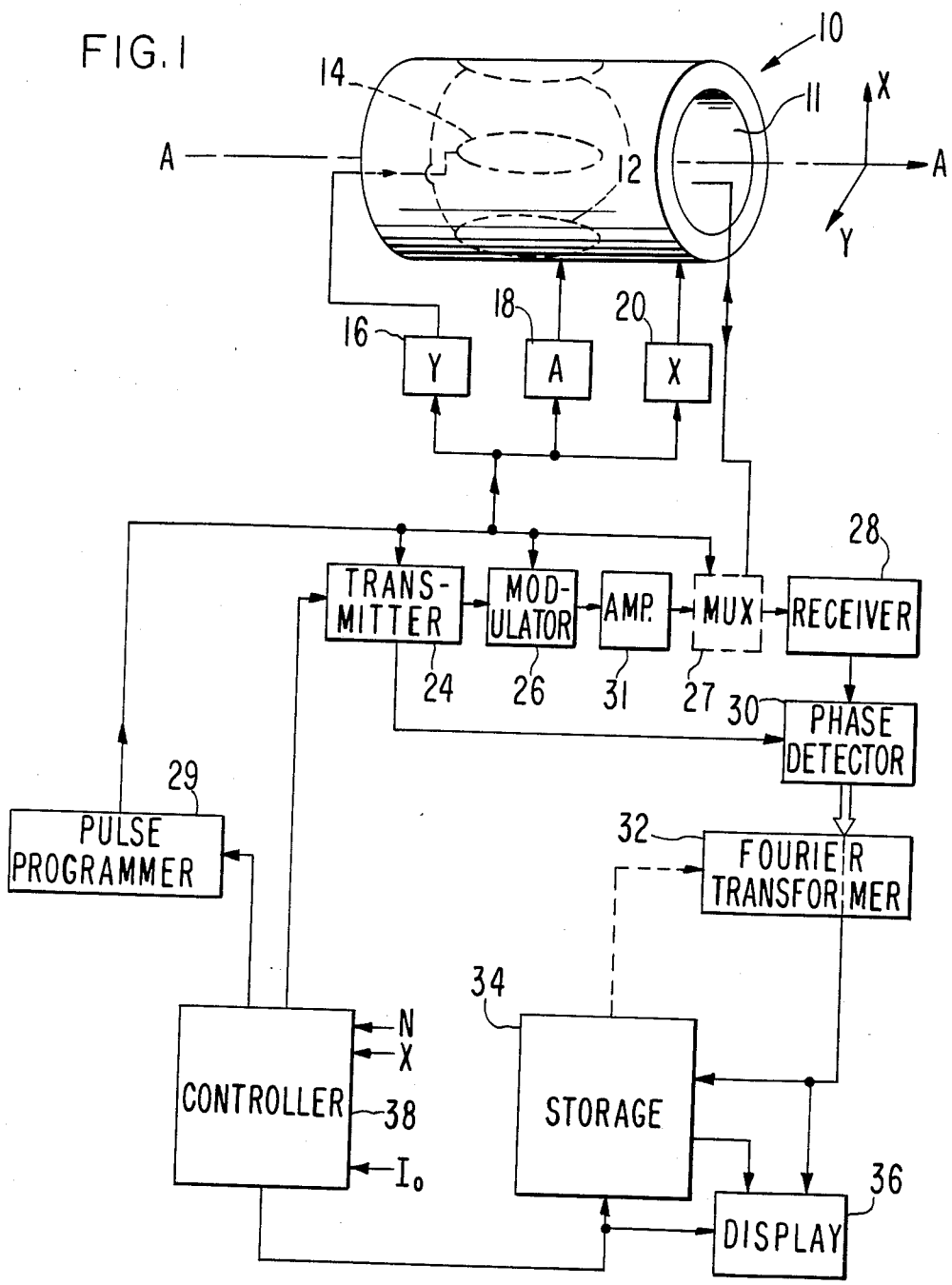

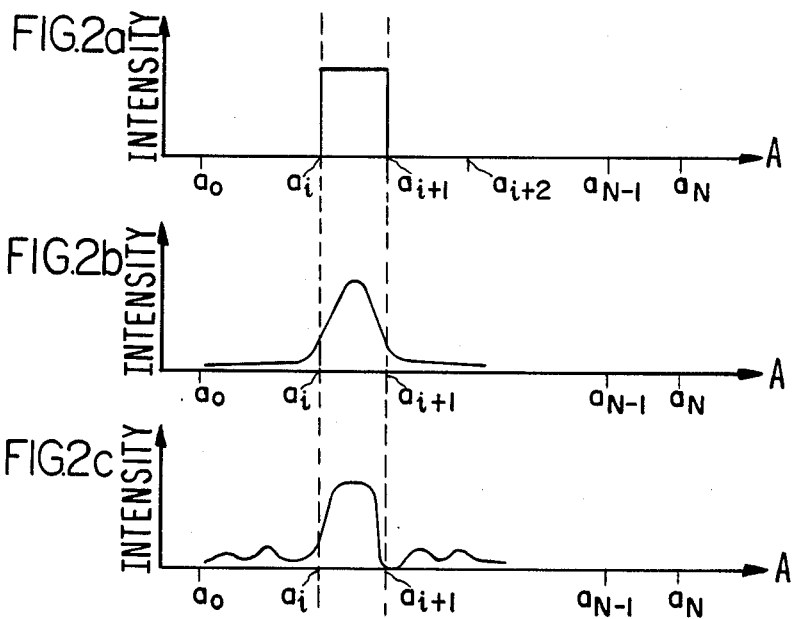
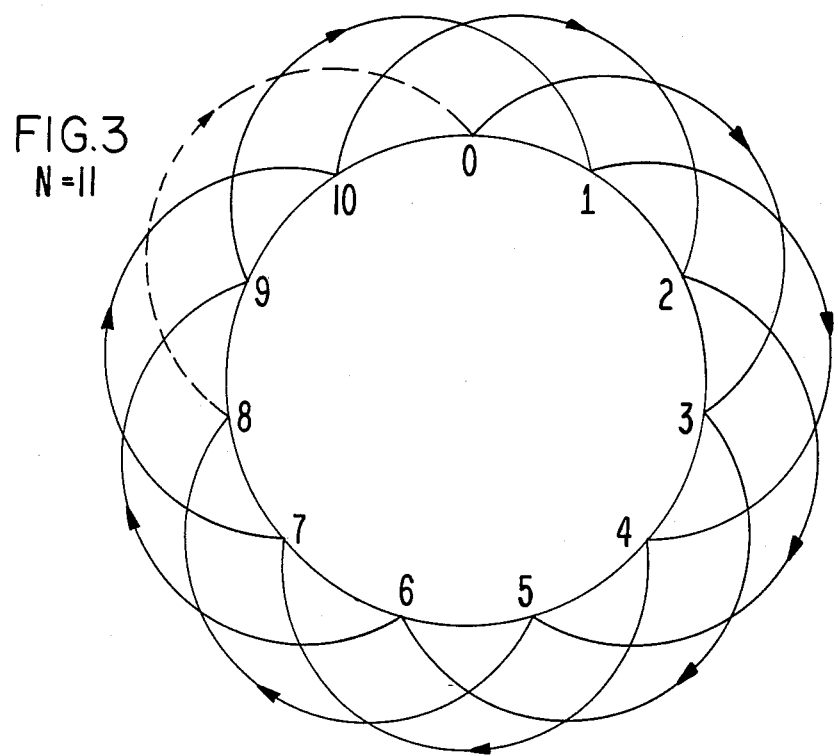

METHOD AND APPARATUS FOR EXECUTION OF MULTISLICE IMAGING EXPERIMENTS

FIELD OF THE INVENTION

The invention is in the field of nuclear magnetic resonance phenomena and relates specifically to the acquisition of NMR data having spatial dependence.

BACKGROUND OF THE INVENTION

Investigation of spatial dependences of NMR phenomena are most often obtained as maps of a two-dimensional section (slice) of the object under examination. Three-dimensional distributions are frequently obtained by obtaining a set of slices spanning the coordinate normal to such slices.

A particular class of such methods that collect data from many slices in a time comparable to the NMR relaxation times is called multislice imaging.

Selection of a slice is often effectuated by imposing a magnetic field gradient along a selected axis in space called the slice selection axis (denoted herein as the A-axis) such that the component of the magnetic field along the slice selection axis is a precisely known (usually linear) function of A. Thus the resonant frequency for the nuclear spins of interest is a function of A. The resonance phenomenon is constrained to an interval on the slice selection axis thorugh use of selective RF irradiation. The excitation profile of an isolated slice would ideally exhibit a rectangular shape to permit the acquisition of an ideal set of precisely contiguous slices without intervening gaps. In non-ideal situations, the shape of the profile has some finite extension along the A-axis outside of the nominal ideal slice; that is, the edges of a slice are not defined precisely. In such cases, the acquisition of contiguous slices is, in reality, an acquisition of partially overlapping slices.

Spatial and temporal proximity for consecutive NMR excitations are recognized to be likely to lead to a degradation in image quality due to overlapping excitation with adjacent slices. It is apparent that one may arrange to obtain a set of adjacent slices by consecutive excitation of every other slice of the set, e.g., even numbered slices and odd numbered slices are separately acquired, each in consecutive order. The spatial and temporal proximity of consecutively excited slides is a matter of degree depending upon the slice thickness (power spectrum bandwidth and shape) as well as the duration of the data acquisition process associated with each such slice.

BRIEF DESCRIPTION OF THE INVENTION

The present invention is directed to optimizing the acquisition of NMR data for contiguous spatially adjacent sections (slices of an object along any desired slice selection axis.

One purpose of the invention is to reduce any degradation in image quality due to overlapping excitation of contiguous slices. Also, if data from a sufficiently large number of slices is collected, the three dimensional distribution that is measured may be reformatted to yield image planes at any selected angle to the slice selection axis A.

In one embodiment of the invention, means are provided for indexing N slices denoted by $S_i$ for $i=0, \ldots, N-1$, where N is a positive integer greater than 6; for calculating a finite sequence $I_0+kX$ for $k=0, \ldots, (N-1)$ where $I_0$ is a selected positive integer and X is an integer relatively prime to N; and for calculating, for each term in the above sequence, the least positive residue $r_k$ satisfying $r_k = i_0 + kX (\text{MOD } N)$ for $k=0, \ldots, (N-1)$, where X is an integer satisfying $r(X)>2$ and $N-r(X)>2$, where $r(X)$ is the least positive residue congruent to X modulo N. Means are also provided which are responsive to the calculated residues $r_k$ for applying a selected excitation signal to slice $S_{rk}$, for $k=0, \ldots, (N-1)$ in the order $k=0, \ldots, (N-1)$ so that a selected excitation signal is applied to slice $S_{rk}$ before being applied to slice $S_{r(k+1)}$ for $k=0, \ldots, (N-2)$.

In another aspect of the invention a method is described for sequentially applying selected excitation signal to selected slices of a physical object. The method includes: selecting the number of slices N, where N is a positive integer greater than 6; indexing (labeling) the slices
$S_0, S_1, \ldots, S_{(N-1)}$;
selecting an integer X which is relatively prime to N and whose least positive residue $r(X)$ satisfies $r(X)>2$ and $N-r(X)>2$; selecting a starting index $I_0$; generating the finite sequence $I_0+kX$ for $k=0, \ldots, (N-1)$; calculating the least positive residue $r_k$ satisfying $r_k = I_0 + kX (\text{MOD } N)$ for $k=0, \ldots, (N-1)$ and then exciting the slice $S_{rk}$ before exciting the slice $S_{r(k+1)}$ for $k=0, \ldots, (N-2)$.

BRIEF DESCRIPTION OF THE FIGURES

FIG. 1 illustrates schematically the context of the invention;

FIG. 2a shows an ideal slice profile (projection) maped onto the A-axis by means of a magnetic field gradient;

FIG. 2b shows a slice profile (projection) determined by a pulse of RF power modulated with a gaussian function;

FIG. 2c shows a slice projection (profile) determined by a pulse of RF power modulated with a sinc function;

FIG. 3 illustrates the method of the present invention for the case $N=11$, $I_0=0$, and $X=3$;

DETAILED DESCRIPTION OF THE INVENTION

Figure 4A:
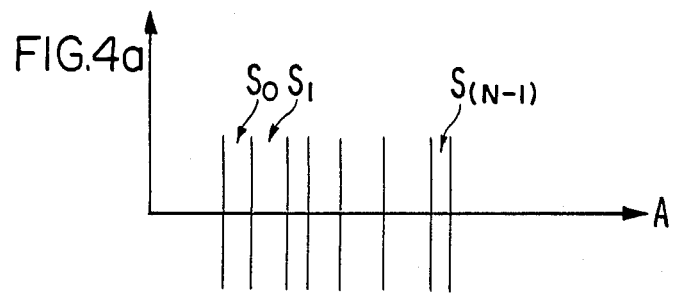
FIGS. 4a and 4b provide examples of indexing the slices to be excited.

Turning now to FIG. 1, there is shown an idealized NMR apparatus. A magnet 10 having bore 11 provides a main magnetic field. In order to control the magnetic field with precision in time and direction, there are provided magnetic field gradient coils 12 and 14 schematically represented. These and an additional gradient coil (not shown) are driven by gradient power supplies 16, 18 and 20, respectively. Additionally, other gradient coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by RF power, such that the rf magnetic field is aligned in a desired orthogonal relationship with the magnetic field in the interior of bore 11. This is accomplished through a transmitter coil in the interior of bore 11 and not shown in FIG. 1. Resonant signals are induced in a receiver coil, proximate the sample within bore 11 and also not shown.

As shown in FIG. 1, RF power is provided from transmitter 24, modulated through modulator 26 to yield amplitude modulated pulses to the RF power which are amplified by amplifier 31 and thence directed via multiplexer 27 to the RF transmitter coil (not shown) located within bore 11. Transmitter and receiver coils are clearly not concurrently active as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

The modulator 26 is controlled by pulse programmer 29 to provide RF pulses of desired amplitude, duration and phase relative to the RF carrier at preselected time intervals. The pulse programmer also controls the gradient power supplies 16, 18 and 20, if such gradients are required. These gradient power supplied may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

FIG. 2a shows a typical "ideal" slice profile mapped onto the A axis by means of a magnetic field gradient along the A axis of bore 11 wherein the A component of the magnetic field is a monotonic (usually linear) function of A. Such an "ideal" slice profile would be 0 to the left of $a_i$ and 0 to the right of $a_{i+1}$, thus defining slice $S_i$ as the region in bore 11 lying between the plane $a=a_i$ and the plane $a=a_{i+1}$. Slice $S_i$ defines a corresponding slice $S'_i$ of an object placed in bore 11 as the portion of the object $S'_i$ lying between these two planes. A plurality of N such ideal slice profiles defines a corresponding plurality of slices $S_i$ where each slice $S_i$ is the region in bore 11 extending from the plane $a=a_i$ to the plane $a=a_{i+1}$ for $i=0, \ldots, N-1$.

The number of slices, N, is an input to controller 38 (shown in FIG. 1). Controller 38 also stores (or alternatively computes) a matrix which associates with each index $i=0, \ldots, N-1$ a measure of the physical location of the corresponding slice $S_i$, for example the center of the slice $S_i$ along the A-axis. This matrix is typically selected so that slice $S_i$ is immediately adjacent slice $S_{i+1}$ for $i=0, \ldots, N-2$. When directed to index i, controller 38 then selects the output signal of RF transmitter 24 so that the slice selection pulse from modulator 26 excites the $i^{th}$ slice.

Figure 4B:
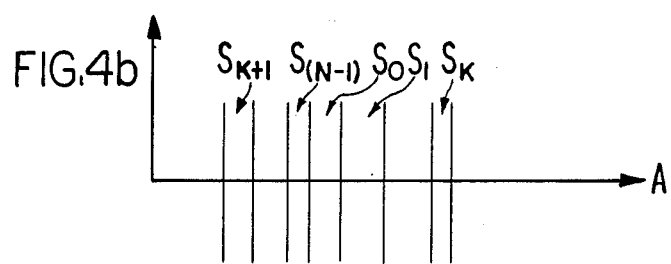
Figure 4C:
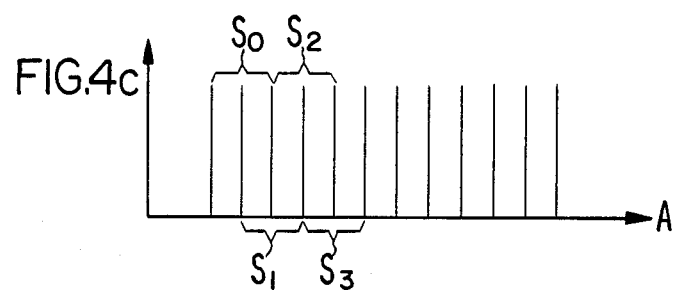
FIG. 4c provides an example of spatially overlapping slices.

Slices $S_0, S_1, \ldots, S_{(N-1)}$ are typically indexed from left to right as shown in FIG. 4a. If desired, the slices may overlap as shown in FIG. 4c. They may also be indexed from right to left (not shown). A further alternative is to index the slices cyclically as shown in FIG. 4b.

The slice selection pulses are non-ideal, so that portions of the physical object lying to the left of $a_i$ and to the right of $a_{i+1}$ are also excited to a greater or lesser degree, depending on the extent to which the excitation deviates from the ideal. FIG. 2b shows a more realistic profile of a slice determined by a pulse of RF power modulated by a gaussian function.

FIG. 2c also shows a realistic slice profile determined by a pulse of RF power produced by transmitter 24 and modulator 26 using a sinc function.

Hence, in multi-slice imaging, if one were to excite a slice immediately adjacent to the ith slice, for example, slice $S_{i+1}$, in a time less than the relaxation time after the slice $S_i$ had been excited, slice $S_{i+1}$ would still be partially excited by the pulse used to select (excite) slice $S_i$. It is well known that this temporal overlap is undesirable since this leads to saturation of the NMR signals and can cause spurious echoes in the NMR signal. One approach for reducing this temporal overlap in selection pulses is to excite the even slices in order $S_0, S_2, \ldots$ and then return to excite the odd slices in order $S_1, S_3, \ldots$. However, depending on the shape of the exciting pulse and its corresponding slice profile, skipping alternate single slices may not be sufficient to ensure a complete independence of excitation so that when slice $S_{i+2}$ is excited, it may also be partially excited by the immediately preceding pulse which excited slice $S_i$.

The present invention provides an apparatus and method for exciting all of the slices $S_i$ for $i=0, \ldots, (N-1)$ while ensuring that the number of slices skipped between successive excitation of slices is always at least 2.

An example of the method of slice selection of the present invention is illustrated in FIG. 3 for the case where there are eleven slices $S_0, S_1, \ldots, S_{10}$. The slices are physically located along the slice selection axis as shown, for example, in FIG. 4a. However, the order of excitation can best be explained by arranging the indices of the slices in a circle as shown in FIG. 3. It is desired to excite all of the eleven slices by successively exciting the slice corresponding to every third index (i.e., by skipping two slice indices between the indices of successively excited slices). Starting at any selected index, for example 0, one determines the order of slice excitation by proceeding clockwise around the circle, skipping two indices and selecting, therefore, every third index. This produces the ordering $S_0, S_3, S_6, S_9, S_1, S_4, S_7, S_{10}, S_2, S_5, S_8$.

One may also determine an ordering by proceeding counterclockwise to produce the ordering $S_0, S_8, S_5, S_2, S_{10}, S_7, S_4, S_1, S_9, S_6, S_3$.

It should also be noted that starting at any selected index and proceeding clockwise to every third index produces the same ordering as proceeding counterclockwise from the same starting index and selecting every eighth index.

The examples provided above and the general method may be more fully understood by applying the well known idea of a "congruence".

Definition: For a, b, N, integers, we say that a is congruent to b modulo N, written $a \equiv b$ (MOD N) if and only if $a-b$ is a multiple of N.

Thus, $a \equiv b$ (MOD N) if and only if there exists an integer q such that $a-b=qN$. It is well known that such a congruence relation modulo a fixed integer N is reflexive, symmetric and transitive and thus defines an equivalence relation on the set of all integers. See, for example, Shapiro, Introduction to the Theory of Numbers, John Wiley and Sons (1983). In particular, see Chapter 5, Congruences, pp. 131-188; in particular, pp. 131-135 which are incorporated herein by reference.

An equivalence relation congruence modulo N partitions the integers into equivalence classes called residue classes. Two integers are in the same residue class if, and only if they are congruent modulo N.

Any number of an equivalence class is called a representative of the class and any set of representatives consisting of a representative from each class is called a complete residue system modulo N.

For a fixed positive integer N it is well known that by applying the division algorithm any given integer a can be represented in one and only one way in the form $a=qN+r$ where r is an integer satisfying $0 \leq r < N$ and q is an integer. In other words, for every integer a there is a unique integer r such that $a \equiv r$ (MOD N) where r is one of the integers $0, 1, \ldots, N-1$. Since no two of the integers $r=0,1,\ldots, N-1$ are congruent modulo N, the set of integers $0,1,\ldots, N-1$ forms a complete residue system called the least positive residue system.

If X is a fixed integer relatively prime to N, then it is also well known that for any fixed integer $I_0$ the finite sequence of integers $I_0+kX, k=0,1,\ldots, N-1$ forms a complete residue system modulo N. See, for example, B. M. Stewart, Theory of Numbers, the McMillan Company, New York (1962). In particular, see Chapter 14 Linear Congruences, pp. 89-95, which are incorporated herein by reference.

Each of the integers $I_0+kX$ in the finite sequence is congruent modulo N to one and only one representative $r_k$ where $0 \leq r_k < N$. This representative $r_k$, the least positive residue, can be calculated by applying the division algorithm. Moreover, since the finite sequence $I_0+kX$ for $k=0, \ldots, (N-1)$ is a complete residue system modulo N, for each representative r satisfying $0 \leq r < N$ there is a member of the sequence $I_0+kX$ congruent to r modulo N.

In terms of the above modular arithmetic, the method of determining the ordering of slices may be expressed as follows.

Determine the number of slices, N. N is chosen to be at least 7. Input this number to controller 38. Label the slices $S_0, S_1, \ldots, S_{N-1}$. This is accomplished by a matrix stored (or computed) in controller 38 which associates with each index i a measure of the physical location of slice $S_i$. The matrix is typically determined so that slice $S_i$ is spatially immediately adjacent slice $S_{i+1}$ for $i=0, \ldots, N-2$. Select the number of slice indices to be skipped, $X-1$ (i.e., we select in order (modulo N) every Xth index). The integer X is chosen to be relatively prime to N. Determine the starting index $I_0$ (typically this index is chosen to be 0). This starting index and the integer X are also inputs to controller 38. Controller 38 then generates the finite sequence $I_0+kX$ for $k=0, \ldots, N-1$. By using the division algorithm, controller 38 calculates the least positive residue $r_k \equiv I_0+kX$(MOD N) for $k=0, \ldots, (N-1)$. Controller 38 then finds the index i in the stored matrix M which is equal to $r_k$ and signals transmitter 24 to excite the slice corresponding to index i. Thus the slices are excited in the order $S_{r0}, S_{r1}, \ldots, S_{r(N-1)}$.

If desired, $-X$ may be substituted for X in the above calculation. Intuitively corresponds to proceeding counterclockwise as explained in connection with FIG. 3.

In practice it is convenient to take $I_0=0$. X is chosen so that $r(X)$, the least positive residue congruent to X modulo N, satisfies $r(X)>2$ and $N-r(X)>2$. This ensures that at least 2 slices are skipped between an excited slice and the next excited slice. It is preferred to choose X so that $r(X)$, the least positive residue congruent to X, is approximately equal to the square root of N. This may be seen by considering the following example. Assume for simplicity that X is positive, $I_0=0$, that $2<X<N$, that the slices are ordered from left to right as shown in FIG. 4a, and that the slices are excited in the order $S_{r0}, S_{r1}, S_{r(N-1)}$ where $r_k \equiv kX$(MOD N) for $k=0,1,\ldots, N-1$. Then we can define a near recurrence index $k_0$ to be the smallest positive integer such that $k_0X>N$. It follows that the least positive residue congruent to $k_0X$, namely $r_{k0}$, satisfies $0<r_{k0}<X$, i.e., $r_0<r_{k0}<r_1$. Since slice $S_{r0}$ was the first slice excited and slice $S_{r1}$ was the second slice excited and $r_0<r_{k0}<r_1$, the slice $S_{rk0}$ lies between the first two slices excited. On the one hand it is obviously desirable to delay the time before this near recurrence condition occurs, which can be accomplished by choosing X to be small; and on the other hand it is desirable to choose X to be large in order to skip more slices between sequentially excited slices. Choosing X approximately equal to the square root of N balances these two considerations and in general yields a sufficiently large number of skips between slices and a sufficiently large near recurrence index.

The method for providing an order for slice excitation described above may be used advantageously to provide sufficient information for 3D imaging.

The multislice data obtained by exciting the slices in the order explained above may be stored in storage unit 34 and processed (reformatted) by controller 38 to yield image data from planes at any angle to the original slice selection axis A.

What is claimed:

1. An apparatus for sequentially applying selected excitation signals to selected slices of a physical object comprising:

means for associating the integer i with a corresponding slice denoted by $S_i$ for $i=0, \ldots, (N-1)$, where N is a positive integer greater than 6;

means for calculating the least positive residue $r_k$ satisfying $r_k \equiv I_0+kX$(MOD N) for $k=0, \ldots, N-1$ where $I_0$ is a selected integer and X is an integer relatively prime to N satisfying $r(X)>2$ and $N-4(X)>2$, where $r(X)$ is the least positive residue congruent to X modulo N; and means, responsive to said residue $r_k$, for applying a selected excitation signal to slice $S_{rk}$, for $k=0, \ldots, (N-1)$ in the order $k=0, \ldots, N-1$ so that a selected excitation signal is applied to slice $S_{rk}$ before being applied to slice $S_{r(k+1)}$ for $k=0, \ldots, (N-2)$.

2. An apparatus as in claim 1 wherein said means for associated includes means for providing that slice $S_i$ is immediately adjacent slice $S_{i+1}$ for $i=0, \ldots, N-2$.

3. An apparatus as in claim 1 wherein $2<X<N$.

4. An apparatus as in claim 3 wherein X is approximately equal to the square root of N.

5. An apparatus as claim 1 wherein $I_0=0$.

6. A method for sequentially applying selected excitation signals to indexed slices $S_i$, $i=0, \ldots (N-1)$ along a slice selection axis through a physical object comprising:

calculating the finite sequence $I_0+kX(\text{MOD } N)$ for $k=0, \ldots, (N-1)$ where $I_0$ is a selected integer and X is an integer relatively prime to N satisfying $r(X)>2$ and $N-r(X)>2$ where $r(X)$ is the least positive residue congruent to X modulo N;

calculating the least positive residue $r_k$ satisfying $r_k \equiv I_0+k(X) \ (\text{MOD } N)$ for $k=0, \ldots, (N-1)$; and applying a selected excitation signal to slice $s_{r_k}$ before applying a selected excitation signal to slice $S_{r(k+1)}$ for $k=0, \ldots, (N-2)$.

7. The method of claim 6 wherein $2<X<N$.

8. The method of claim 7 wherein X is approximately equal to the square root of N.

9. The method of claim 6 wherein $I_0=0$.

10. The method of claim 6 further including the step of storing data obtained from said slices excited by said selected excitation signals and reformatting said data to obtain image data from planes at a selected angle to said slice selection axis.

* * * * *